(12) United States Patent
Ripy et al.

(10) Patent No.: US 7,342,814 B2
(45) Date of Patent: Mar. 11, 2008

(54) CONTENT ADDRESSABLE MEMORY WITH REDUCED SEARCH CURRENT AND POWER

(75) Inventors: Paul Brian Ripy, Laurens, SC (US); Gary Jay Geerdes, Santa Rosa, CA (US); Paul Edwin O'Connor, Grass Valley, CA (US); Christophe Pierre Leroy, Rohnert Park, CA (US)

(73) Assignee: Tellabs Petaluma, Inc., Petaluma, CA (US)

( * ) Notice: Subject to any disclaimer, the term of this patent is extended or adjusted under 35 U.S.C. 154(b) by 0 days.

(21) Appl. No.: 11/331,926

(22) Filed: Jan. 13, 2006

(65) Prior Publication Data

US 2006/0114706 A1 Jun. 1, 2006

Related U.S. Application Data

(63) Continuation of application No. 10/963,245, filed on Oct. 12, 2004, now Pat. No. 7,006,400.

(51) Int. Cl.
*G11C 15/00* (2006.01)
(52) U.S. Cl. ............... 365/49; 365/189.07; 365/230.03
(58) Field of Classification Search .................. 365/49, 365/189.07, 230.03, 78, 190, 191
See application file for complete search history.

(56) References Cited

U.S. PATENT DOCUMENTS

| | | | |
|---|---|---|---|
| 4,791,606 A | 12/1988 | Threewitt et al. ............. 365/49 |
| 5,452,243 A | 9/1995 | Ansel et al. .................. 365/49 |
| 5,485,418 A | 1/1996 | Hiraki et al. .................. 365/49 |
| 6,199,140 B1 | 3/2001 | Srinivasan et al. ......... 711/108 |
| 6,288,922 B1 | 9/2001 | Wong et al. .................. 365/49 |
| 6,324,087 B1 * | 11/2001 | Pereira ........................ 365/49 |
| 6,362,993 B1 | 3/2002 | Henderson et al. ........... 365/49 |
| 6,373,738 B1 | 4/2002 | Towler et al. ................ 365/49 |
| 6,515,884 B1 | 2/2003 | Sywyk et al. ................. 365/49 |
| 6,538,911 B1 * | 3/2003 | Allan et al. ................... 365/49 |
| 6,654,276 B2 | 11/2003 | Brooks ....................... 365/154 |
| 6,690,595 B1 | 2/2004 | Srinivasan et al. ........... 365/49 |
| 6,707,693 B1 | 3/2004 | Ichiriu ......................... 365/49 |
| 6,829,153 B1 * | 12/2004 | Park et al. .................... 365/49 |
| 6,879,532 B1 * | 4/2005 | Proebsting et al. ......... 365/203 |
| 6,954,823 B1 * | 10/2005 | James et al. ................ 711/108 |
| 2002/0036912 A1 | 3/2002 | Helwig ........................ 365/49 |
| 2003/0093646 A1 | 5/2003 | Stark .......................... 711/219 |
| 2004/0022082 A1 | 2/2004 | Khanna ....................... 365/49 |
| 2004/0130924 A1 | 7/2004 | Ma et al. ...................... 365/49 |
| 2006/0114706 A1 * | 6/2006 | Ripy et al. .................... 365/49 |

* cited by examiner

*Primary Examiner*—Anh Phung
*Assistant Examiner*—Dang Nguyen
(74) *Attorney, Agent, or Firm*—Mark C. Pickering

(57) ABSTRACT

The power required to search a content addressable memory (CAM) is substantially reduced by forming the CAM to have a number of CAM banks with a corresponding number of power switches that control power to the CAM banks, and then controlling the power to search the CAM banks one at a time.

27 Claims, 4 Drawing Sheets

CONTENT ADDRESSABLE MEMORY WITH REDUCED SEARCH CURRENT AND POWER

RELATED APPLICATIONS

The present application is a continuation of prior application Ser. No. 10/963,245 filed on Oct. 12, 2004, now U.S. Pat. No. 7,006,400 issued on Feb. 28, 2006, by Paul Brian Ripy, et al for "Content Addressable Memory with Reduced Instantaneous Current and Power Consumption During a Search."

BACKGROUND OF THE INVENTION

1. Field of the Invention

The present invention relates to a content addressable memory and, more particularly, to a content addressable memory with reduced instantaneous current and power consumption during a search.

2. Description of the Related Art

A content addressable memory (CAM) is a memory cell array which has been modified to facilitate a high-speed search of the contents of the array. Any conventional memory cell structure, such as a static random access memory (SRAM), a dynamic random access memory (DRAM), or a non-volatile memory (NVM), can be modified to form a CAM.

FIG. 1 shows a circuit diagram that illustrates a prior-art, SRAM cell 100. As shown in FIG. 1, SRAM cell 100, which is a six-transistor structure, includes a first transistor M1 that has a gate connected to a word line WORD, a drain connected to a bit line BIT, and a source connected to a first intermediate node N1. Cell 100 also includes a second transistor M2 that has a gate connected to the word line WORD, a drain connected to an inverted bit line /BIT, and a source connected to a second intermediate node N2.

Further, cell 100 includes a third transistor M3 that has a gate connected to the first intermediate node N1, a drain connected to the second intermediate node N2, and a source connected to ground. A fourth transistor M4, in turn, has a gate connected to the second intermediate node N2, a drain connected to the first intermediate node N1, and a source connected to ground.

In addition, cell 100 includes a fifth transistor M5 and a sixth transistor M6. Fifth transistor M5 has a gate connected to the first intermediate node N1, a drain connected to the second intermediate node N2, and a source connected to a supply voltage VCC. Sixth transistor M6 has a gate connected to the second intermediate node N2, a drain connected to the first intermediate node N1, and a source connected to the supply voltage VCC.

In operation, to program cell 100 to store, for example, a logic zero, a first positive voltage is placed on the word line WORD, ground is placed on the bit line BIT, and a second positive voltage is placed on the inverted bit line /BIT. The first and second positive voltages can be equal to, for example, the supply voltage VCC.

Under these conditions, transistor M1 pulls the voltage on the first intermediate node N1 down to ground which, in turn, turns off transistor M3 and turns on transistor M5. When transistor M5 turns on, transistor M5 pulls the voltage on the second intermediate node N2 up to the supply voltage VCC.

The rising voltage on the second intermediate node N2 turns on transistor M4 and turns off transistor M6. When transistor M4 turns on, transistor M4 additionally pulls the voltage on the first intermediate node N1 down to ground.

After a programming period, the first and second positive voltages are removed. As a result of these steps, a logic zero is stored on the first intermediate node N1, and the inverse is stored on the second intermediate node N2.

To read cell 100, the first positive voltage is again placed on the word line WORD, and ground is placed on the bit line BIT. The current flow from cell 100 is then sensed to determine the state of cell 100. For example, if a logic zero is stored on the first intermediate node N1, then no current flows when ground is placed on the bit line BIT. When no current flows, the cell is read as storing a logic zero. On the other hand, if a logic one is stored on the first intermediate node N1, then a current flows when ground is placed on the bit line BIT. When current flows, the cell is read as storing a logic one.

FIG. 2 shows a circuit diagram that illustrates a prior-art, SRAM-based CAM cell 200. Cell 200 is similar to cell 100 and, as a result, utilizes the same reference numerals to designate the structures which are common to both cells. As shown in FIG. 2, cell 200 differs from cell 100 in that cell 200 has four additional transistors, which include seventh, eighth, ninth, and tenth transistors M7, M8, M9, and M10, along with a match line MATCH.

Seventh transistor M7 has a gate connected to the bit line BIT, a drain connected to the match line MATCH, and a source connected to a node N3. Eighth transistor M8 has a gate connected to the inverted bit line /BIT, a drain connected to the match line MATCH, and a source connected to a node N4.

Ninth transistor M9 has a gate connected to the first intermediate node N1, a drain connected to ground, and a source connected to node N3 and the source of transistor M7. Tenth transistor M10 has a gate connected to the second intermediate node N2, a drain connected to ground, and a source connected to node N4 and the source of transistor M8.

In operation, CAM cell 200 is programmed and read in the same manner that cell 100 is programmed and read. In addition, CAM cell 200 also supports a hardware search that determines whether a data value stored by CAM cell 200 matches a search value, known as a comparand. To conduct a search, the match line MATCH is initially pulled high via a large resistor R that is connected to the supply voltage VCC.

To determine whether the data value stored by CAM cell 200 matches a search value, the search value is placed on the bit line BIT and the inverse of the search value is placed on the inverted bit line /BIT. If the match line MATCH remains high, then a match has been detected. On the other hand, if the match line MATCH is pulled low, then no match was detected.

For example, if a logic zero is stored on the first intermediate node N1, a logic one is stored on the second intermediate node N2, a logic zero search value is placed on the bit line BIT, and a logic one is placed on the inverted bit line /BIT, the logic zero on the bit line BIT turns off transistor M7 which, in turn, prevents transistor M7 from pulling down the voltage on the match line MATCH.

In addition, although the logic one on the inverted bit line /BIT turns on transistor M8, transistor M10 remains turned off due to the logic one placed on the gate of transistor M10. As a result, the voltage on the match line MATCH remains high. Thus, since the match line MATCH was not pulled down by either transistors M7/M9 or M8/M10, the logic zero of the search value matches the logic zero stored on the first intermediate node N1.

On the other hand, if the search value is a logic one such that a logic one is placed on the bit line BIT and a logic zero is placed on the inverted bit line /BIT, then the logic one on the bit line BIT turns on transistor M7. In addition, since a logic zero is stored on the first intermediate node N1 in this example, transistor M9 is also turned on. As a result, the voltage on the match line MATCH is pulled low, thereby indicating that no match was detected.

FIG. 3 shows a circuit diagram that illustrates a prior-art, CAM cell array 300. As shown in FIG. 3, CAM cell array 300 includes a large number of CAM cells 200 that are arranged in rows and columns, where the rows represent a series of words WORD0-WORDN and the columns represent a series of bits Bit0-Bitm.

Further, CAM cell array 300 includes a series of word lines WL0-WLn such that each word line WL contacts the gates of transistors M1 and M2 of each cell 200 in a row of cells. Array 300 also includes a corresponding series of match lines ML0-MLn such that each match line ML contacts the drains of transistors M7 and M8 of each cell 200 in a row of cells.

CAM cell array 300 additionally includes a series of bit lines BL0-BLm such that each bit line BL contacts the drain of transistor M1 and the gate of transistor M7 of each cell 200 in a column of cells. Array 300 further includes a corresponding series of inverted bit lines /BL0-/BLm such that each inverted bit line /BL contacts the drain of transistor M2 and the gate of transistor M10 of each cell 200 in a column of cells.

In operation, a multi-bit binary search value is placed on the bit lines BL. For example, if the value to be searched for is 01 . . . 0, then zero is placed on bit line BL0, a one is placed on bit line BL1, and a zero is placed on bit line BLm. In addition, a one is placed on inverted bit line /BL0, a zero is placed on bit line /BL1, and a one is placed on bit line /BLm.

Under these conditions, the voltage on each match line ML0-MLn is pulled to zero unless the data value stored in a row of CAM cell array 300 exactly matches the search value. In the case where the data value stored in a row of array 300 exactly matches the search value, the voltage on the match line ML remains high.

Thus, after a search period, if a match line ML of the match lines ML0-MLn remains high, a match was found in the array. In addition, the match line ML that remains high, and the bit lines that received the search value, uniquely identify a location in CAM cell array 300 where the match resides.

As a result, when a match line ML remains high following a search to indicate that a match has been found, the address of the match line ML along with any bit line information is output as an index, and a hit signal is generated by logically ORing together all of the match lines ML0-MLn to indicate that a match has been found. Thus, a hit signal is generated each time any of the match lines ML0-MLn remain high following a search period.

When multiple hits are present, such as when some of the bits have been masked off so that the search value does not include all of the bits in a row, the lowest address and bit line information to have a hit is first output as the index. Following this, the address and bit line information of each sequential hit is sequentially clocked out as the index with a clock signal.

Although CAM cell array 300 allows the contents of the array 300 to be searched very quickly, one drawback of CAM cell array 300 is that CAM cell array 300 consumes a significant amount of power when performing a search.

During a search, in each cell 200 that does not match a search value, transistors M7/M9 or transistors M8/M10 sink current from a match line ML to pull the voltage on the match line ML to ground.

As a result, in large CAM cell arrays, a large number of CAM cells 200 instantaneously and simultaneously turn on and sink current from most, if not all, of the match lines ML0-MLn to pull the voltage on the match lines ML0-MLn down to ground. As a result, large CAM cell arrays have a significant instantaneous power requirement.

SUMMARY OF THE INVENTION

The present invention provides a content addressable memory (CAM) that has reduced instantaneous current and power consumption during a search. The CAM in accordance with an embodiment of the present invention includes two or more CAM arrays, where each CAM array has rows and columns of CAM cells. In addition, the CAM includes a logic circuit that is connected to the two or more CAM arrays to search only one CAM array at a time to determine if a data value that matches a comparand is stored in a CAM array.

A method of forming a content addressable memory (CAM) is disclosed according to an embodiment of the present invention. Two or more CAM arrays are formed where each CAM array has rows and columns of CAM cells. In addition, a logic circuit is formed to be connected to the two or more CAM arrays to search only one CAM array at a time to determine if a data value that matches a comparand is stored in a CAM array.

A better understanding of the features and advantages of the present invention will be obtained by reference to the following detailed description and accompanying drawings that set forth an illustrative embodiment in which the principles of the invention are utilized.

DETAILED DESCRIPTION OF THE INVENTION

Figure 1:
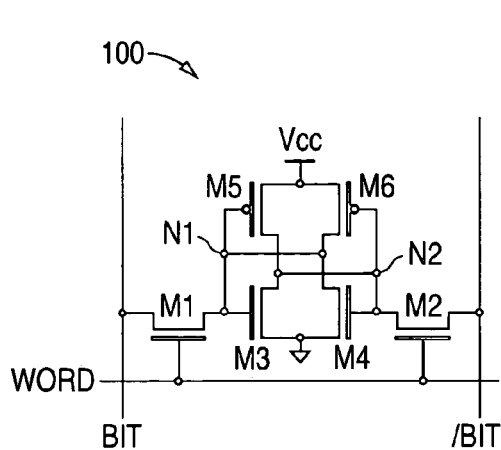
FIG. 1 is a circuit diagram illustrating a prior-art, SRAM cell 100.
Figure 2:
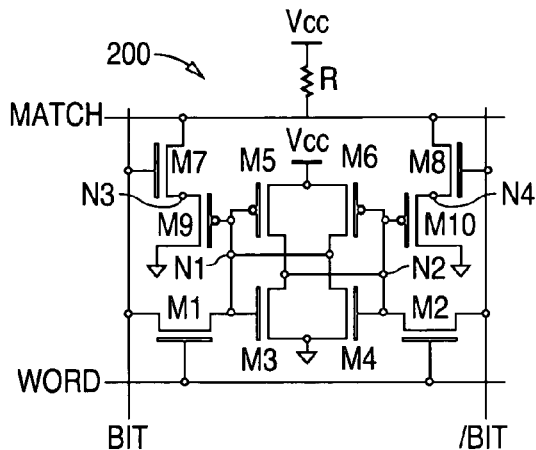
FIG. 2 is a circuit diagram illustrating a prior-art, SRAM-based CAM cell 200.
Figure 3:
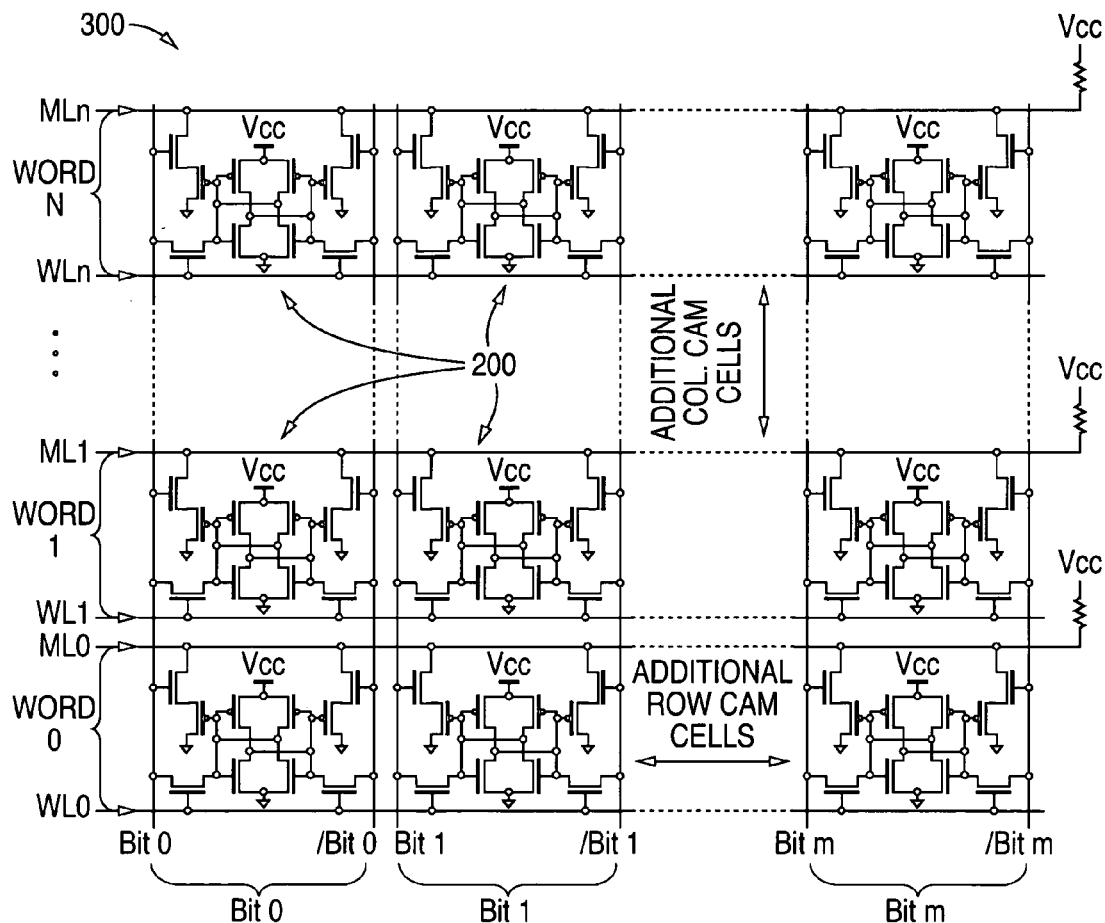
FIG. 3 is a circuit diagram illustrating a prior-art, CAM array 300.
Figure 4:
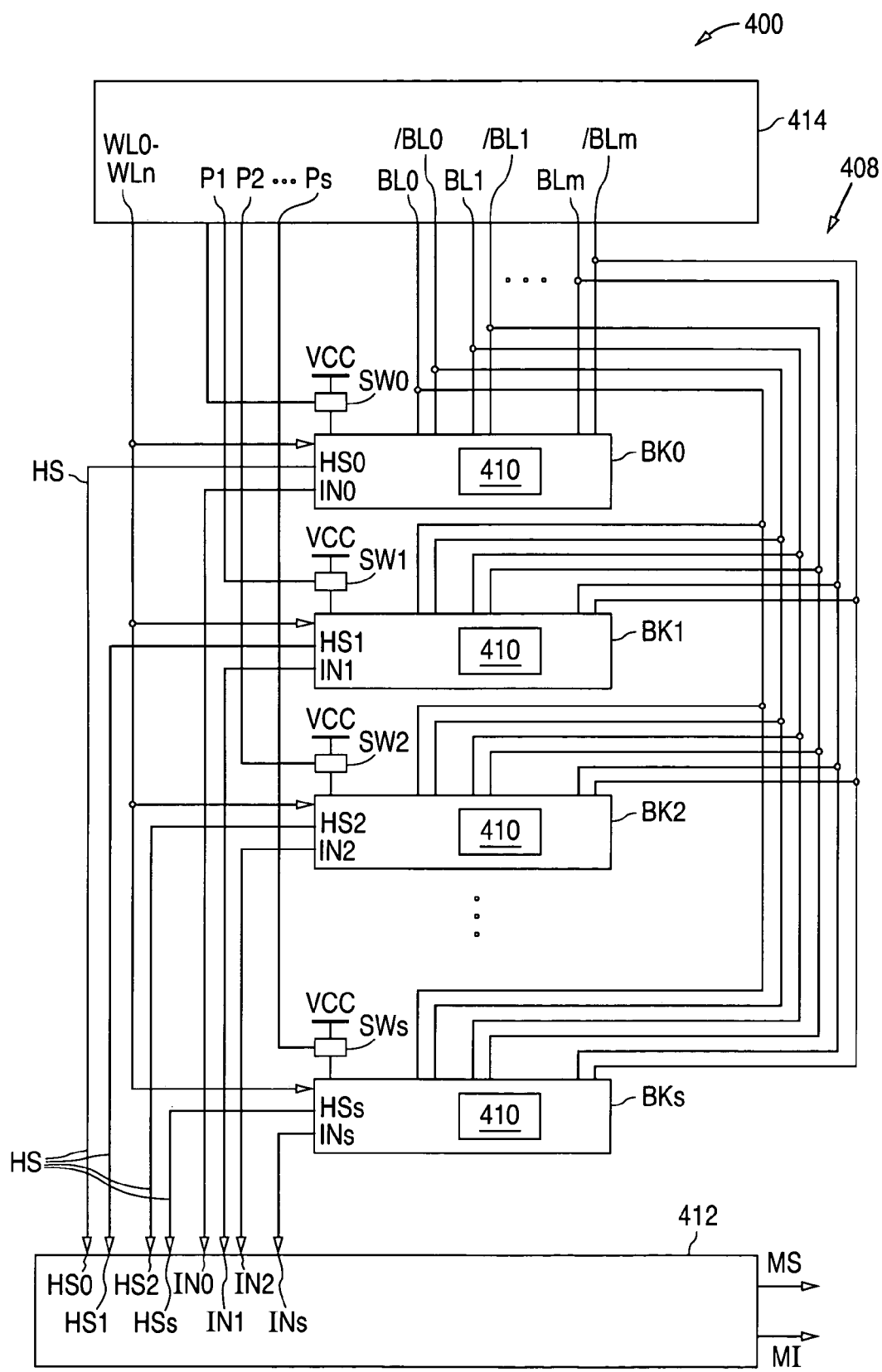
FIG. 4 is a circuit diagram illustrating a content addressable memory (CAM) 400 in accordance with the present invention.

FIG. 4 shows a circuit diagram that illustrates a content addressable memory (CAM) 400 in accordance with the present invention. As described in greater detail below, the instantaneous current and power consumption required to search a CAM are substantially reduced by forming the CAM to have a number of CAM banks, and then searching the CAM banks one at a time.

As shown in FIG. 4, CAM 400 includes a CAM array 408 that stores a number of data values, which can represent any type of information. In accordance with the present invention, CAM array 408 includes a series of CAM banks BK0-BKs. Each CAM bank BK, in turn, includes a CAM cell array 410 that differs from any conventional CAM cell array only in size. As a result, each CAM bank BK includes a series of match lines.

For example, CAM cell array 300 is commonly implemented as an 8K×64-bit device, which has 8K word lines and match lines, while each CAM cell array 410 can be implemented as, for example, a 1K×64-bit device, which has 1K word lines and match lines. Thus, in the present example, eight 1K×64-bit CAM banks BK0-BK7 provide the same memory capacity as a single 8K×64-bit CAM cell array, such as CAM cell array 300.

Further, the CAM banks BK0-BKs output a series of hit signals HS0-HSs and a corresponding series of index signals IN0-INs such that each CAM bank BK generates a hit signal HS and an index signal IN when a match is found between a data value stored in the CAM bank BK and the search value.

Each of the match lines in a CAM bank BK are logically ORed together to form a hit signal HS. Thus, whenever any match line in a CAM bank BK remains high following a search period, a hit signal HS is output by the CAM bank BK. The hit signal HS indicates that a match was found in the CAM bank BK, while the index signal IN includes location information of where the match was found in the CAM bank BK.

CAM array 408 additionally includes a single hit and index encoder circuit 412 that is connected to receive an index signal IN and a hit signal HS from each CAM bank BK. Circuit 412 logically ORs together the hit signals HS0-HSs from the CAM banks BK0-BKs to output a master hit signal MS.

As a result, the master hit signal MS is a logic high each time any of the hit signals HS from any CAM bank BK remains high following a search period. In addition, circuit 412 also outputs the index IN from the CAM bank BK that asserted the hit signal HS as a master index MI (which identifies the address and bit line information of the hit or match).

Thus, CAM array 408 outputs a master hit signal MS and a master index signal MI when a match is found between a search value and a data value stored in any CAM bank BK of CAM array 408. The master hit signal MS indicates that a match was found, while the master index signal MI includes location information of where the match was found.

As further shown in FIG. 4, CAM 400 includes a series of word lines WL0-WLn that are connected to all of the CAM banks BK0-BKs so that all of the CAM banks BK0-BKs can be connected to the same word lines WL. For example, the first word line in a CAM cell array in one CAM bank BK is connected to the first word line in the CAM cell array in each other CAM bank BK by the word line WL0. Each word line WL, in turn, has a logic state.

Further, CAM 400 includes a series of bit lines BL0-BLm that are connected to all of the CAM banks BK0-BKs so that all of the CAM banks BK0-BKs can be connected to the same bit lines BL. For example, the first bit line (BIT0) in a CAM cell array in one CAM bank BK is connected to the first bit line (BIT0) in the CAM cell array in each other CAM bank BK by the bit line BL0. Each bit line BL, in turn, has a logic state.

Depending on the type of memory cell used to implement CAM cell array 410, CAM 400 can optionally include a series of inverted bit lines /BL0-/BLm that are connected to all of the CAM banks BK0-BKs so that all of the CAM banks BK0-BKs can be connected to the same inverted bit lines /BL. For example, bit line /BL0 in one CAM bank BK is connected to bit line /BL0 in each other CAM bank BK by the inverted bit line /BL0.

Further, CAM 400 includes a series of power switches SW0-SWs that are connected between each CAM bank BK and the supply voltage VCC. When turned on, a power switch SW passes power to a CAM bank BK to provide the power needed to pull up the voltages on the match lines. In addition, when turned off, a switch SW removes power from the match lines of the CAM bank BK. CAM 400 additionally includes a plurality of power lines P0-Ps that are connected to the power switches SW0-SWs. The power lines P0-Ps, in turn, have logic states that control the on and off states of the switches SW0-SWs.

CAM 400 also includes a state machine 414 that controls the logic states which are placed on the word lines WL0-WLn, the bit lines BL0-BLn (the inverted bit lines /BL0-/BLn when present), and the power lines P0-Ps to control CAM array 408. In accordance with the present invention, state machine 414 determines which CAM bank BK can respond to the logic states placed on the word and bit lines WL and BL by controlling the logic states that are placed on the power lines P0-Ps.

The logic states placed on the power lines P0-Ps apply and remove power from the match lines of the CAM cell array of the CAM banks BK0-BKS. As a result, state machine 414 can allow only one CAM bank BK to respond at a time to the logic states placed on the word lines WL0-WLn and the bit lines BL0-BLn.

In operation, the match lines of each CAM cell array in each CAM bank BK are sequentially pulled up by sequentially turning on each of the power switches SW0-SWs such that only one power switch SW is turned on, and therefore only the match lines of a single CAM bank BK are pulled up, at any given time.

For example, when the search of a first CAM bank BK0 is finished, power switch SW0, which corresponds with first CAM bank BK0, is turned off, and power switch SW1, which corresponds with a second CAM bank BK1 is turned on, for a search period, thereby pulling up only the match lines ML0-MLn of second CAM bank BK1.

Thus, one of the advantages of the present invention is that, since the match lines of only one CAM bank BK are powered up at a time, the present invention requires substantially less instantaneous current and power than a conventional CAM. For example, when searching all entries, CAM 400 with eight 1K×64-bit banks BK0-BK7 requires approximately ⅛ the instantaneous current as does a prior-art CAM with a single 8K×64-bit array.

In addition, when searching to find the location of an entry known to be present, such that the search stops when the entry is found, CAM 400 consumes approximately one-half the power of a conventional CAM because, on average, only one-half of CAM array 408 needs to be searched.

The reduced instantaneous current and power consumption provided by the present invention comes at the cost of increased search time. Assume, for example, that 10 nS is required to search each CAM bank BK, then 80 nS is required to search eight CAM banks. 80 nS equates to 12.5 million CAM searches per second.

An optimal power versus search time determination can be made by varying the size of each CAM bank BK. For example, by cutting the number of banks BK to four, where each bank BK has a 2K×64-bit size, the number of searches per second doubles to approximately 25 million, while the power consumption increases by a factor of approximately two. Conversely, by doubling the number of banks BK to 16, where each bank BK has a 512×64-bit size, the number of searches per second is cut in half to approximately 6.25 million, while the power consumption decreases again by a factor of approximately two.

Figure 5:
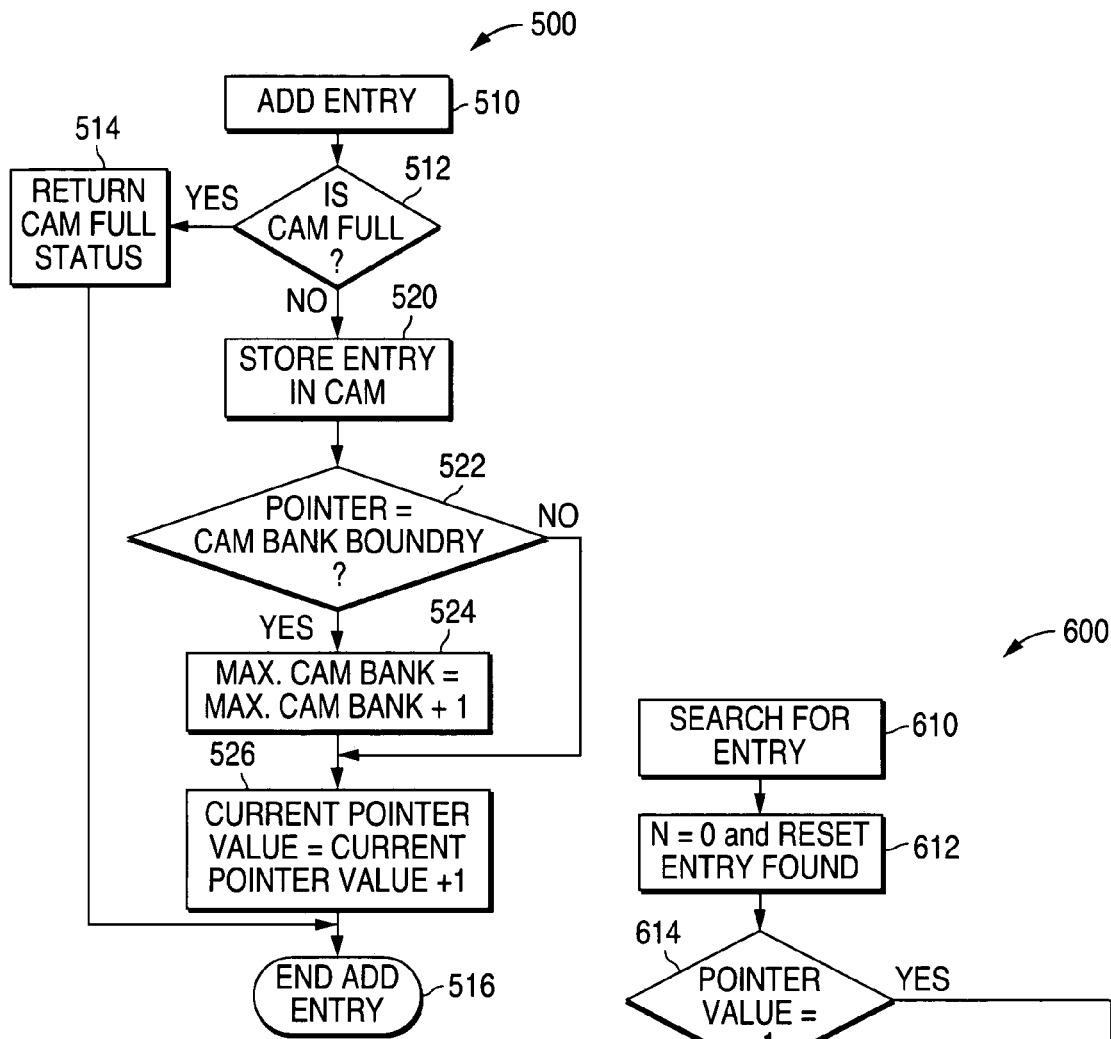
FIG. 5 is a flow chart illustrating a method 500 of adding entries to a CAM in accordance with the present invention.

FIG. 5 shows a flow chart that illustrates a method 500 of adding entries to a CAM in accordance with the present invention. As shown in FIG. 5, method 500 begins at step 510 when an add entry command is received, and then moves to step 512 to determine if the CAM is full. When the CAM is full, method 500 moves to step 514 to output a CAM full status signal, and then to step 516 to end.

On the other hand, when the CAM is not full, method 500 moves to step 520 to add an entry to the CAM. When entries are added, the entries are added in a sequential manner from, for example, the lowest address to the highest address. Thus, the first row can receive the first entry, the second row can receive the second entry, and the third row can receive the third entry. This ensures that entries are not scattered throughout the CAM banks.

In addition, the CAM includes a current CAM bank pointer that points to the current CAM bank BK, and a last address pointer that identifies the address of a last valid entry (last in space, not in time) in a sequence of entries. For example, in a sequentially increasing case where the first through the fourth rows include valid entries and the fifth row includes an invalid (or no) entry, the last address pointer points to the address of the fourth row.

Thus, when an entry is added in step 520, method 500 stores the entry in the CAM at the address that is next in sequence after the address identified by the last address pointer. In the present example, the fifth row is the next address in sequence. As a result, the entry is stored in the fifth row.

Following this, method 500 moves to step 522 to determine if the address identified by the last address pointer is at the CAM bank boundary. When the address is at the CAM bank boundary, method 500 moves to step 524 to increase the CAM bank pointer by one, and then to step 526 to increase the last address pointer by one. As a result, the last address pointer now points to the address of the data value that was just entered. On the other hand, when the address is not at the CAM bank boundary, method 500 moves directly to step 526 to increase the last address pointer by one. From step 526, method 500 moves to step 516 to end.

Figure 6:
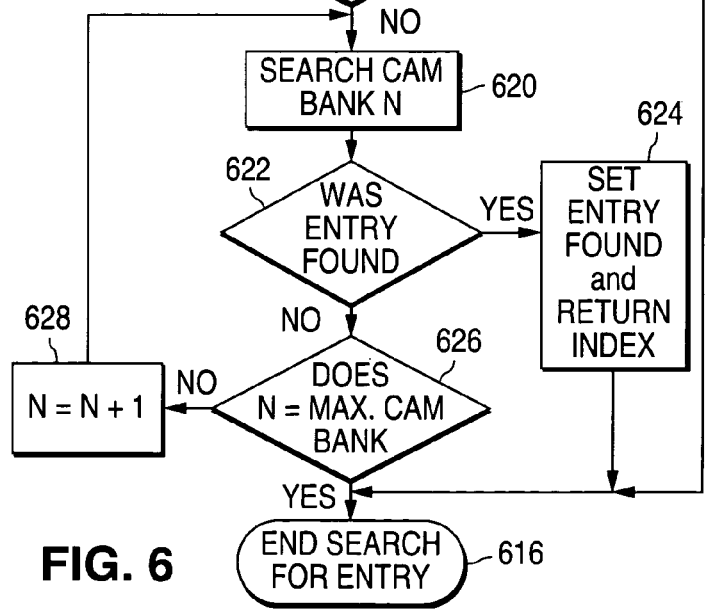
FIG. 6 is a flow chart illustrating a method 600 of searching a CAM for an entry in accordance with the present invention.

FIG. 6 shows a flow chart that illustrates a method 600 of searching a CAM for an entry in accordance with the present invention. As shown in FIG. 6, method 600 begins at step 610 when a search entry command is received, and then moves to step 612 to reset a hit signal to no hit, and a CAM bank counter value N to zero.

Following this, method 600 moves to step 614 to determine if the last address pointer is equal to −1. When a CAM is empty, the last address pointer is equal to −1 so that when an entry has been made to the first row, the last address pointer can be incremented by one to zero to point to the last address that was used. Thus, when the last address pointer is equal to −1, the CAM is empty and method 600 moves to step 616 to end.

When the last address pointer is not equal to −1, method 600 moves to step 620 to search the first CAM bank BK0 and, after a search period, moves to step 622 to determine if a match was found. When a match is found, method 600 moves to step 624 to set the hit signal to indicate that a match was found, and output the address and bit line information of where the match is located as the index. Following this, method 600 moves to step 616 to end.

On the other hand, when a match is not found, method 600 moves to step 626 to determine if the CAM bank counter value N is equal to a maximum CAM bank value. When the values are equal, method 600 moves to step 616 to end as all of the banks have been searched without finding a hit. When the values are not equal, method 600 moves to step 628 to increase the variable N by one, and then to step 620 to search the next CAM bank. The process continues to loop through until a hit is detected or the last CAM bank has been searched.

Figure 7:
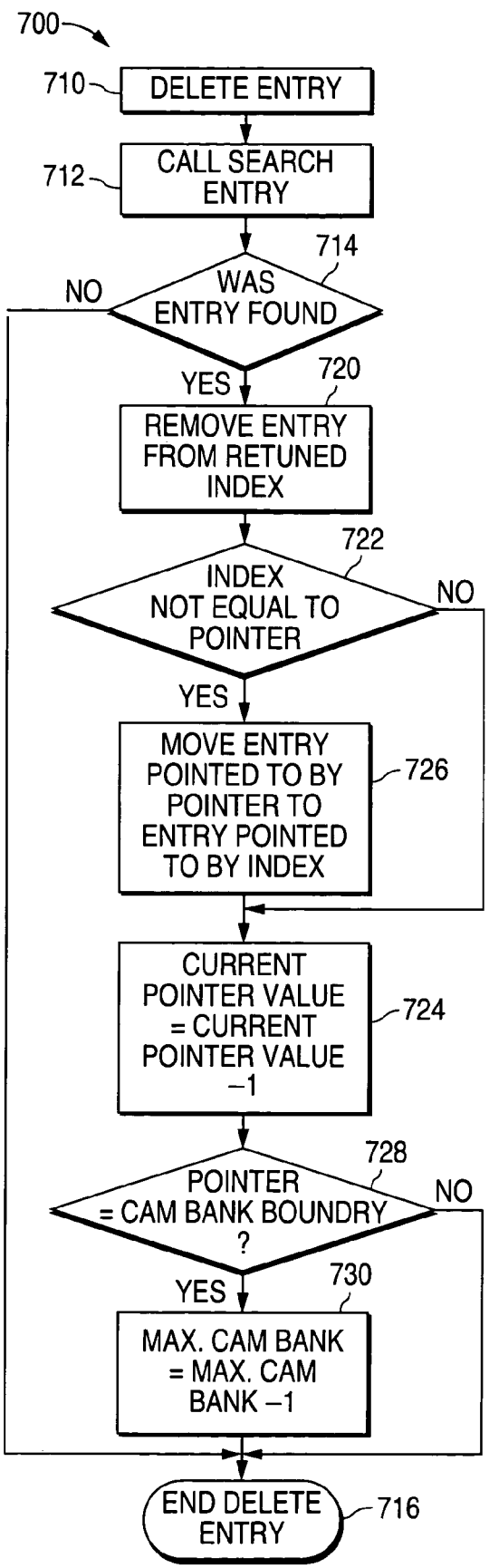
FIG. 7 is a flow chart illustrating a method 700 of deleting entries from a CAM in accordance with the present invention.

FIG. 7 shows a flow chart that illustrates a method 700 of deleting entries from a CAM in accordance with the present invention. As shown in FIG. 7, method 700 begins at step 710 when a delete entry command is received, and then moves to step 712 to search for the entry to determine the address of the entry. The entry can be searched for using, for example, method 600.

Following this, method 700 moves to step 714 to determine if the entry was found. If no entry was found, method 700 moves to step 716 to end as there is no entry to remove. On the other hand, when the entry is found, method 700 moves to step 720 to remove the entry that is identified in the index.

Next, method 700 moves to step 722 to determine if the address identified by the index is the same as the address identified by the last address pointer. If the two are the same, then the entry that was deleted was the last entry in the sequence. In this case, method 700 moves to step 724 to reduce the value of the last address pointer by one.

On the other hand, if the address identified by the index is not the same as the address identified by the last address pointer, then the entry that was deleted was not the last entry in the sequence. In this case, method 700 moves to step 726 to move the entry identified by the last address pointer to the address that was identified by the index.

Thus, the entry identified by the last address pointer is used to replace the entry that was deleted. Method 700 is performed so that no other operation on CAM array 408 can be initiated until method 700 has been completed. This insures an atomic operation while moving the last entry to fill the hole where the deleted entry existed. Following this, method 700 moves to step 724 to reduce the value of the last address pointer by one.

From step 724, method 700 moves to step 728 to determine if the last address pointer is equal to an upper CAM bank boundary. If not, method 700 moves to step 716 to end. On the other hand, if the last address pointer is equal to an upper CAM bank boundary, method 700 moves to step 730 to reduce the maximum CAM bank value by one, and then to step 716 to end.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A content addressable memory (CAM) comprising:
   two or more CAM arrays, each CAM array having rows and columns of CAM cells;
   a controller connected to the two or more CAM arrays to search the two or more CAM arrays only one CAM array at a time to determine if a data value that matches a comparand is stored in a CAM array; and two or more power switches connected to the two or more CAM arrays such that each power switch is connected to a different CAM array.

2. CAM of claim 1 and further comprising two or more power control lines connected to the controller and the two or more power switches so that each power control line is connected to a different power switch, each power control line having a first logic state that causes a power switch to pass power to a CAM array and a second logic state that causes the power switch to remove power from the CAM array.

3. The CAM of claim 2 wherein the controller controls the logic states placed on the power control lines so that only one CAM array receives power at a time.

4. The CAM of claim 3 and further comprising an encoder circuit connected to the two or more CAM arrays to output a match signal when a CAM array indicates that a stored data value matches the comparand, and index information that indicates where the stored data value is located.

5. The CAM of claim 3 wherein a row of cells in a CAM array stores a number of bits of data, and the comparand has an equivalent number of bits of data.

6. The CAM of claim 3 wherein a row of cells in a CAM array stores a number of bits of data, and the comparand has a smaller number of bits of data.

7. The CAM of claim 3 and further comprising two or more word lines connected to the controller and each CAM array.

8. The CAM of claim 5 wherein each word line is connected to each CAM array.

9. The CAM of claim 8 and further comprising two or more bit lines connected to the controller and each CAM array.

10. The CAM of claim 9 wherein each bit line is connected to each CAM array.

11. The CAM of claim 5 and further comprising two or more bit lines connected to the controller and each CAM array.

12. The CAM of claim 11 wherein each bit line is connected to each CAM array.

13. A content addressable memory (CAM) comprising:
two or more CAM arrays, each CAM array having rows and columns of CAM cell;
two or more bit lines connected to the controller and each CAM array so that each bit line is connected to each CAM array; and
a controller connected to the two or more CAM arrays to search the two or more CAM arrays only one CAM array at a time to determine if a data value that matches a comparand is stored in a CAM array, the controller to:
set a CAM array entry pointer, an address pointer, and a CAM array counter value to an initial value when the two or more CAM arrays are empty;
store an entry in a location identified by the CAM array pointer and the address pointer;
increment the address pointer when an entry is stored; and
increment the CAM array pointer when a current CAM array is full.

14. The CAM of claim 13 wherein, to search for an entry, the controller:
places the comparand on the bit lines; and
provides power to a CAM array identified by the CAM array counter value.

15. The CAM of claim 14 wherein the controller:
removes power from the CAM array identified by the CAM array counter value;
determines if the CAM array counter value is equal to a maximum CAM array counter value;
increases the CAM array counter value by one when the CAM array counter value is not equal to the maximum CAM array counter value; and
provides power to a next CAM array identified by the CAM array counter value.

16. A method of forming a content addressable memory (CAM) comprising:
forming two or more CAM arrays, each CAM array having rows and columns of CAM cells;
forming a controller connected to the two or more CAM arrays to search the two or more CAM arrays only one CAM array at a time to determine if a data value that matches a comparand is stored in a CAM array; and
forming two or more power switches connected to the two or more CAM arrays such that each power switch is connected to a different CAM array.

17. The method of claim 16 and further comprising forming two or more power control lines connected to the controller and the two or more power switches so that each power control line is connected to a different power switch, each power control line having a first logic state that causes a power switch to pass power to a CAM array and a second logic state that causes the power switch to remove power from the CAM array.

18. The method of claim 17 wherein the controller controls the logic states placed on the power control lines so that only one CAM array receives power at a time.

19. The method of claim 18 and further comprising forming an encoder circuit connected to the two or more CAM arrays to output a match signal when a CAM array indicates that a stored data value matches the comparand, and index information that indicates where the stored data value is located.

20. The method of claim 18 wherein a row of cells in a CAM array stores a number of bits of data, and the comparand has an equivalent number of bits of data.

21. The method of claim 18 wherein a row of cells in a CAM array stores a number of bits of data, and the comparand has a smaller number of bits of data.

22. The method of claim 18 and further comprising forming two or more word lines connected to the controller and each CAM array.

23. The method of claim 22 wherein each word line is connected to each CAM array.

24. The method of claim 23 and further comprising forming two or more bit lines connected to the controller and each CAM array.

25. The method of claim 24 wherein each bit line is connected to each CAM array.

26. The method of claim 22 and further comprising forming two or more bit lines connected to the controller and each CAM array.

27. The method of claim 26 wherein each bit line is connected to each CAM array.

* * * * *

UNITED STATES PATENT AND TRADEMARK OFFICE
CERTIFICATE OF CORRECTION

PATENT NO. : 7,342,814 B2  Page 1 of 1
APPLICATION NO. : 11/331926
DATED : March 11, 2008
INVENTOR(S) : Ripy et al.

It is certified that error appears in the above-identified patent and that said Letters Patent is hereby corrected as shown below:

<u>Title Page</u>,

Item (56) References Cited, Col. 2, insert --OTHER PUBLICATIONS-- and insert --Jon P. Wade and Charles G. Sodini, "Dynamic Cross-Coupled Bit-Line Content Addressable Memory Cell For High-Density Arrays", IEEE Journal Of Solid-State Circuits, Vol. SC-22, No. 1, February 1987, pps. 119-121.--

<u>Column 6</u>,

Line 29, delete "BK0-BKS" and replace with --BK0-BKs--.

<u>Column 9</u>,

Line 4, before "CAM" insert --The--.

Line 43, delete "cell;" and replace with --cells;--.

Signed and Sealed this

Eighth Day of July, 2008

JON W. DUDAS
*Director of the United States Patent and Trademark Office*